(12) United States Patent
Morrow (10) Patent No.: US 7,745,940 B2
(45) Date of Patent: Jun. 29, 2010

(54) FORMING ULTRA DENSE 3-D INTERCONNECT STRUCTURES

(75) Inventor: Patrick R. Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 11/673,375

(22) Filed: Feb. 9, 2007

(65) Prior Publication Data

US 2007/0145601 A1 Jun. 28, 2007

Related U.S. Application Data

(62) Division of application No. 11/322,058, filed on Dec. 28, 2005, now abandoned.

(51) Int. Cl.
*H01L 23/48* (2006.01)
(52) U.S. Cl. ............... 257/774; 257/700; 257/698; 257/777; 257/778
(58) Field of Classification Search ........... 438/109, 438/455, 598, 637, 649
See application file for complete search history.

(56) References Cited

U.S. PATENT DOCUMENTS

| 4,837,609 | A | * | 6/1989 | Gurvitch et al. | 257/43 |
| 6,124,179 | A | * | 9/2000 | Adamic, Jr. | 438/309 |
| 6,429,509 | B1 | * | 8/2002 | Hsuan | 257/690 |
| 6,957,413 | B1 | * | 10/2005 | McKeone et al. | 716/18 |
| 7,312,487 | B2 | * | 12/2007 | Alam et al. | 257/278 |

* cited by examiner

*Primary Examiner*—Julio J. Maldonado
*Assistant Examiner*—Jarrett J Stark
(74) *Attorney, Agent, or Firm*—Kathy J. Ortiz (57) ABSTRACT

Methods of forming a microelectronic structure are described. Embodiments of those methods include bonding at least one bond pad of a device side of a first substrate to at least one bond pad of a device side of a second substrate, forming at least one via to connect to at least one of an active feature and an interconnect structure disposed within the first substrate, and forming a reactive material on a surface of at least one of the active features.

8 Claims, 12 Drawing Sheets

FORMING ULTRA DENSE 3-D INTERCONNECT STRUCTURES

CROSS-REFERENCED TO RELATED APPLICATION

This application is a divisional of U.S. patent application Ser. No. 11/322,058, filed Dec. 28, 2005.

BACKGROUND OF THE INVENTION

Stacked substrate arrangements are electronic devices having a plurality of stacked semiconductor die/chips/wafers that are physically and electrically interconnected with one another. Stacked substrate technology offers a number of potential benefits, including improved form factors, lower costs, enhanced performance, and greater integration through "system-on-chip" solutions.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a stacked substrate structure, are described. Those methods may comprise bonding at least one bond pad of a device side of a first substrate to at least one bond pad of a device side of a second substrate, forming at least one via to connect to at least one of an active feature and an interconnect structure disposed within the first substrate; and then forming a reactive material on a surface of at least one of the active features.

Figure 1A:
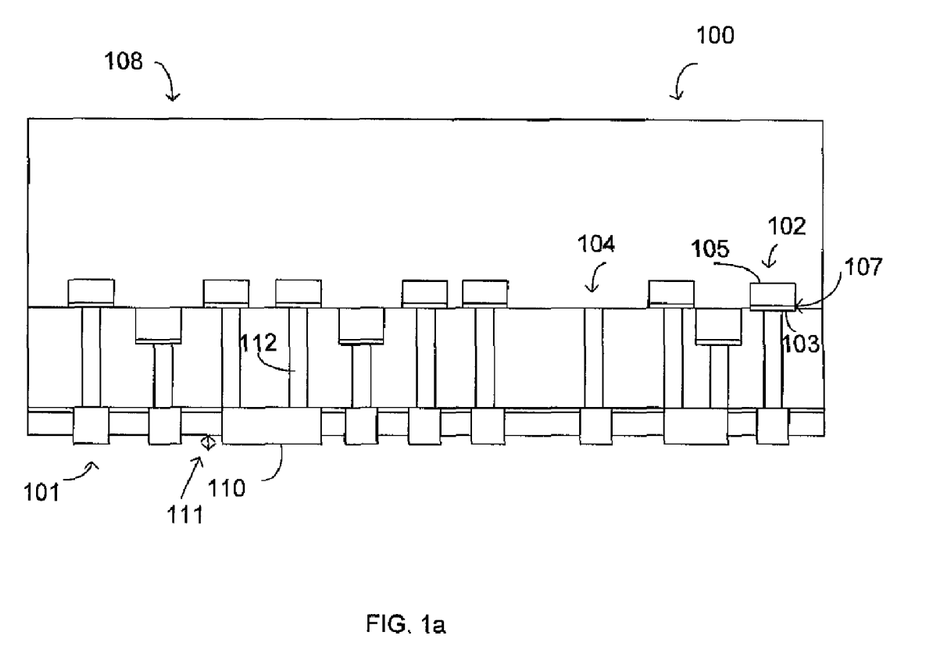
FIGS. 1a-1k represent methods of forming structures according to an embodiment of the present invention.

FIGS. 1a-1k illustrate an embodiment of a method of forming a microelectronic structure, such as a stacked substrate structure, for example. FIG. 1a illustrates a first substrate 100. In one embodiment, the first substrate 100 may comprise a material such as but not limited to silicon, silicon germanium and silicon on insulator (SOI). In one embodiment, the first substrate 100 may comprise a wafer, such as a wafer to be used in the manufacture of a microelectronic device, for example. In another embodiment, the first substrate 100 may comprise an individual die.

In one embodiment, the first substrate 100 may comprise a device side 101 and a non-device side 108. The non-device side 108 may comprise a portion of the first substrate 100 that may not substantially comprise active features, such as various circuit elements, as are known in the art. In one embodiment, the non-device side 108 may comprise silicon, for example. The device side 101 of the first substrate 100 may comprise at least one active feature 102.

In one embodiment, the at least one active feature 102 may comprise at least one of a source, drain and gate structure, for example. In one embodiment, the at least one active feature 102 may comprise a first side 103 and a second side 105. In one embodiment, the at least one active feature 102 may comprise at least one of a polysilicon, a metal, and a doped silicon region. In general, the at least one active feature 102 may comprise any feature that may be electrically active, as opposed to an isolation feature, for example.

The first side 103 of the at least one active feature 102 may comprise a reactive material 107. In one embodiment, the reactive material 107 may comprise a suicide, such as a nickel or a cobalt silicide, by illustration and not limitation. The reactive material 107 may comprise any material that may react (for example, may form an intermetallic and/or silicide) with the material of the at least one active feature 102. In one embodiment, the reactive material 107 may be disposed on a portion of the at least one active feature 102, an need not cover the entire first side 103 of the at least one active area 102.

The first substrate 100 may further comprise at least one interconnect structure 104. In one embodiment, the at least one interconnect structure 104 may comprise a conductive material, such as but not limited to tungsten, copper, aluminum, for example. In one embodiment, the at least one interconnect structure 104 may comprise a metallic conductive trace of a microelectronic device. The first substrate 100 may further comprise at least one bond pad 110 disposed on the device side 101.

Figure 1B:
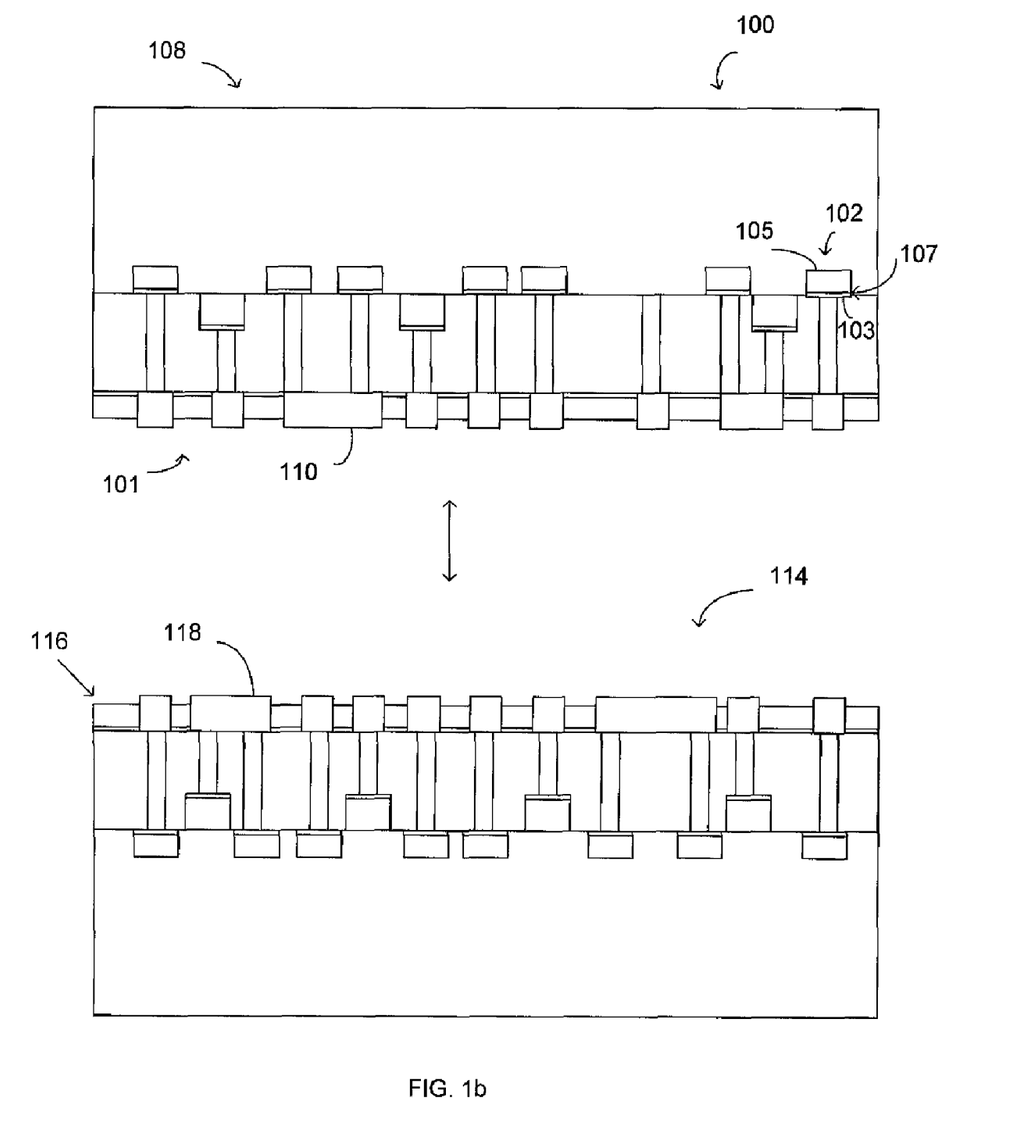
Figure 1C:
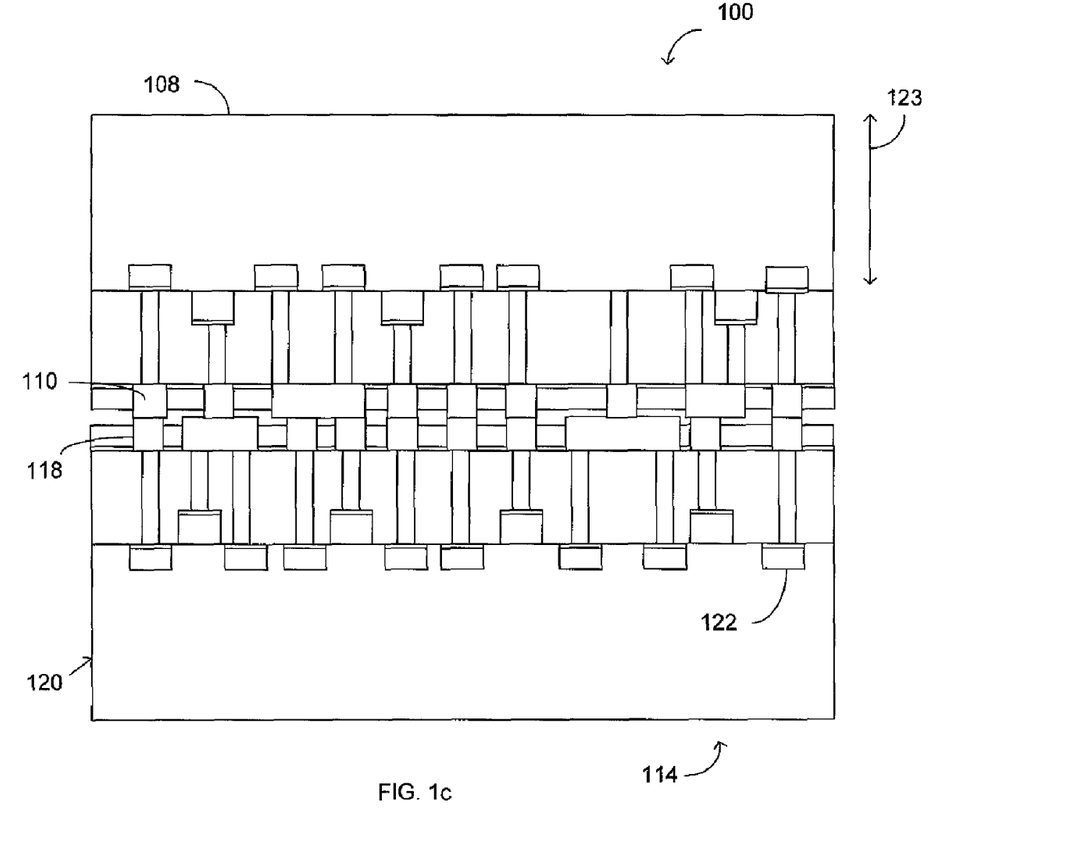

The at least one bond pad 110 may be electrically coupled to the at least one active feature 102 and/or the at least one interconnect structure 104 through at least one via 112, as are known in the art. In one embodiment, the at least one via 104 may comprise an interconnection between metal layers of a microelectronic device, for example. In one embodiment, the at least one bond pad 110 may not be coplanar with the device side 101 of the first substrate 100, and may extend beyond the plane of the first substrate 100 by a distance 111. The distance 111 will depend upon the particular application, and may be varied to facilitate subsequent bonding processes to be described further herein. The at least one bond pad 110 may comprise copper, in one embodiment, A device side 116 of a second substrate 114 may be bonded to the device side 101 of the first substrate 100 (FIG. 1b). In one embodiment, the second substrate 114 may comprise similar materials and circuit features as the first substrate 100. In one embodiment, the second substrate 114 may be bonded to the first substrate 100 by bonding at least one bond pad 118 disposed on the second substrate 114 to the at least one bond pad 110 disposed on the first substrate 100 (FIG. 1c). The first substrate 100 and the second substrate 114 may be bonded together using any suitable bonding method, such as thermal bonding, for example. The second substrate 114 may comprise at least one active feature 122, similar to the at least one active feature 102 of the first substrate 100. The first substrate 114 may further comprise a non-device side 120.

Figure 1D:
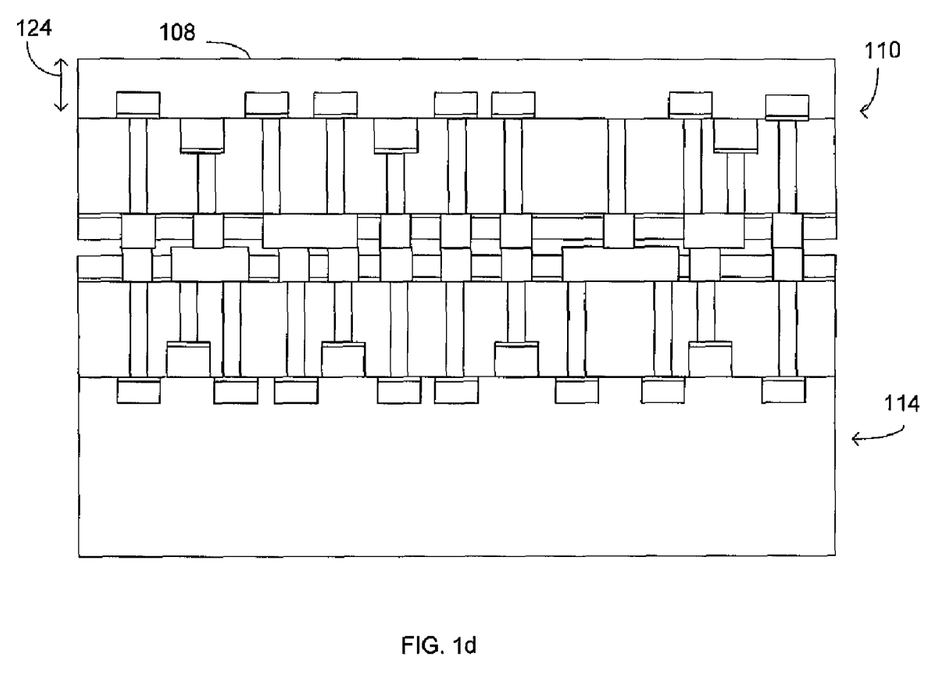

The first substrate 100 may comprise a first thickness 123 of the non-device side 108. In one embodiment, a portion of the non-device side 108 of the first substrate 100 may be thinned to a thinned thickness 124 (FIG. 1d). The portion of the non-device side 108 of the first substrate 100 may be thinned using any suitable technique, such as chemical mechanical polishing (CMP), polishing and grinding, for example. In one embodiment, the non-device side 108 may comprise a thinned thickness of about 10 microns or less.

Figure 1E:
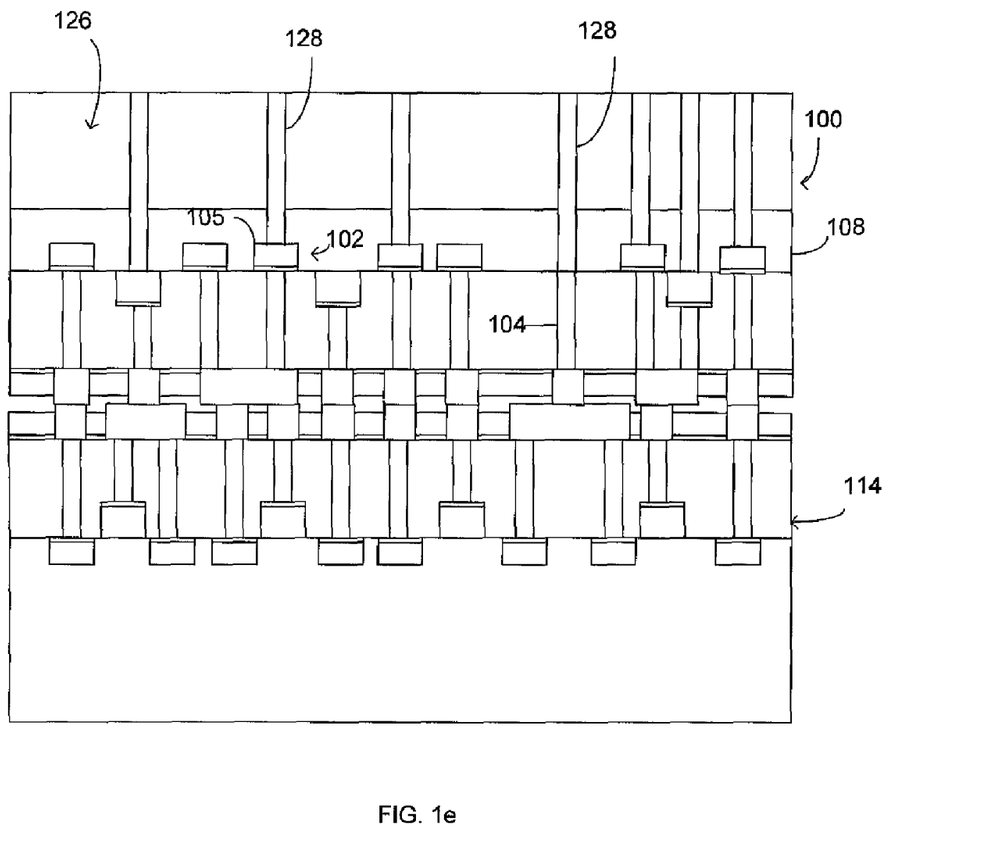

A dielectric layer 126 may be formed on the non-device side 108 of the first substrate 100 (FIG. 1e). In one embodiment, the dielectric layer 126 may comprise an oxide (e.g., $SiO_2$). In general, the dielectric layer 126 may comprise any other suitable insulating material, such as a nitride (e.g., $Si_3N_4$) or a carbide (e.g., SiC). The dielectric layer 126 may be deposited using any suitable technique, such as CVD, spin-on, or sputtering, by illustration and not limitation. In one embodiment, the dielectric layer 126 may comprise a thickness of about 50 nanometers or less. In another embodiment, the dielectric layer 126 may comprise a thickness of about 200 nm or less. In one embodiment, the thickness of the dielectric layer 126 may depend upon the thickness of the at least one bond pad 110, but will depend upon the particular application in general.

Figure 1F:
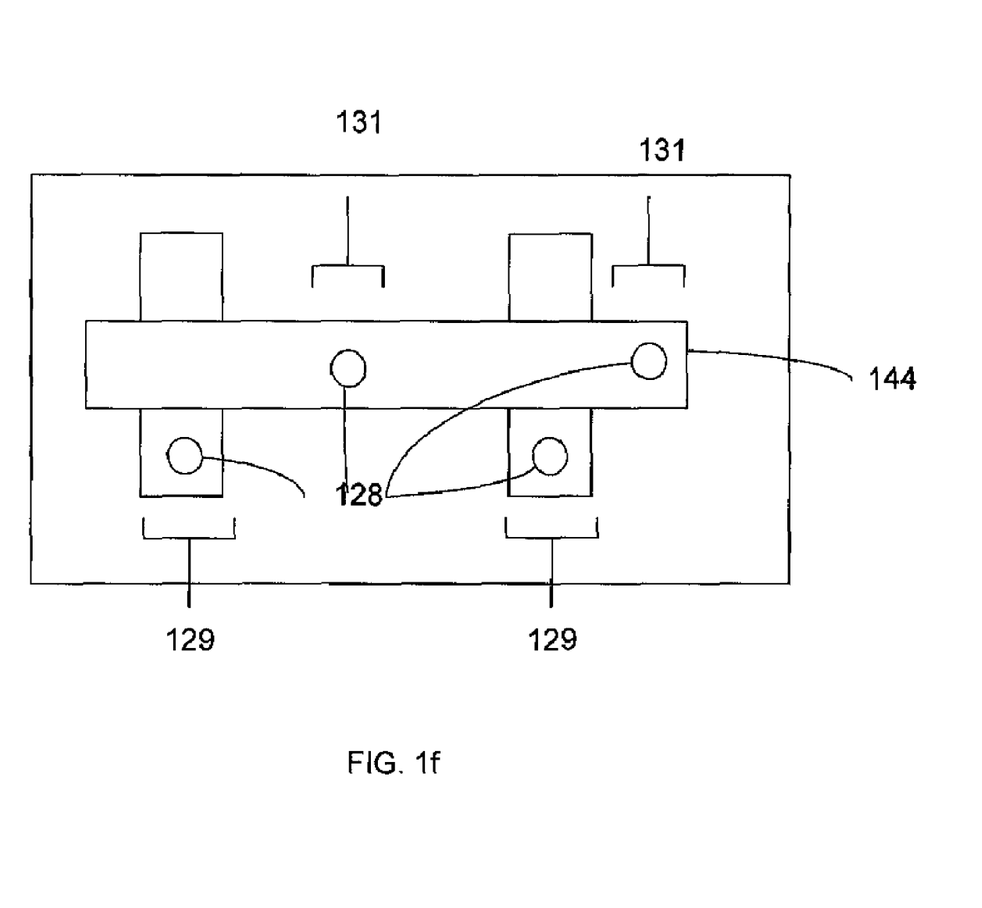

In one embodiment, at least one via 128 may be formed to connect to at least one of the at least one active feature 102 and the interconnect structure 104 disposed within the first substrate 100. In one embodiment, where the at least one via may connect to a gate structure of a transistor for example, the at least one via 128 may be connected to the gate structure in an offset region, which may be offset laterally from the channel region (FIG. 1f, top view of a transistor area). Referring to FIG. 1f, the at least one via 128 may be disposed within a source/drain region 129, but in the case of the gate structure 144, it is desirable that the at least one via 128 be disposed in an offset region 131, in order to avoid interfering with the channel region of the transistor.

Figure 1G:
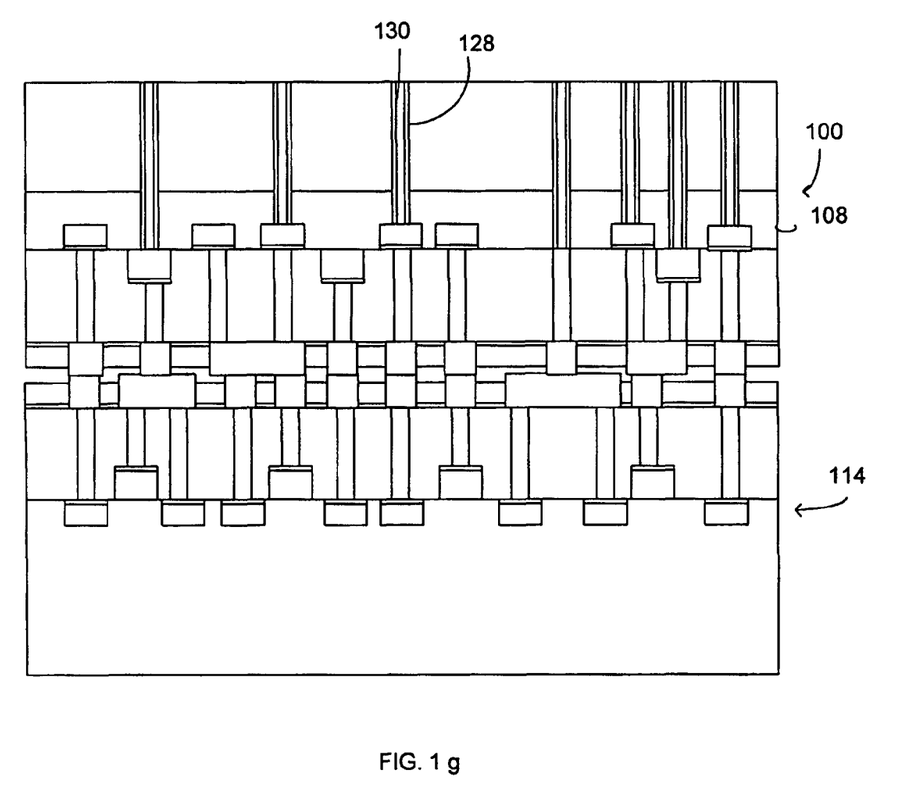

Referring back to FIG. 1e, the at least one via 128 may extend through the non-device side 108 of the first substrate 100, as well as extending through the dielectric layer 126. The at least one via 128 may be disposed on the second side 105 of the at least one active feature 102. In one embodiment, the at least one via 128 may be lined with a dielectric lining material 130, such as silicon dioxide or silicon nitride, for example (FIG. 1g). The dielectric lining material 130 may be formed by any suitable deposition means, such as CVD for example.

Figure 1H:
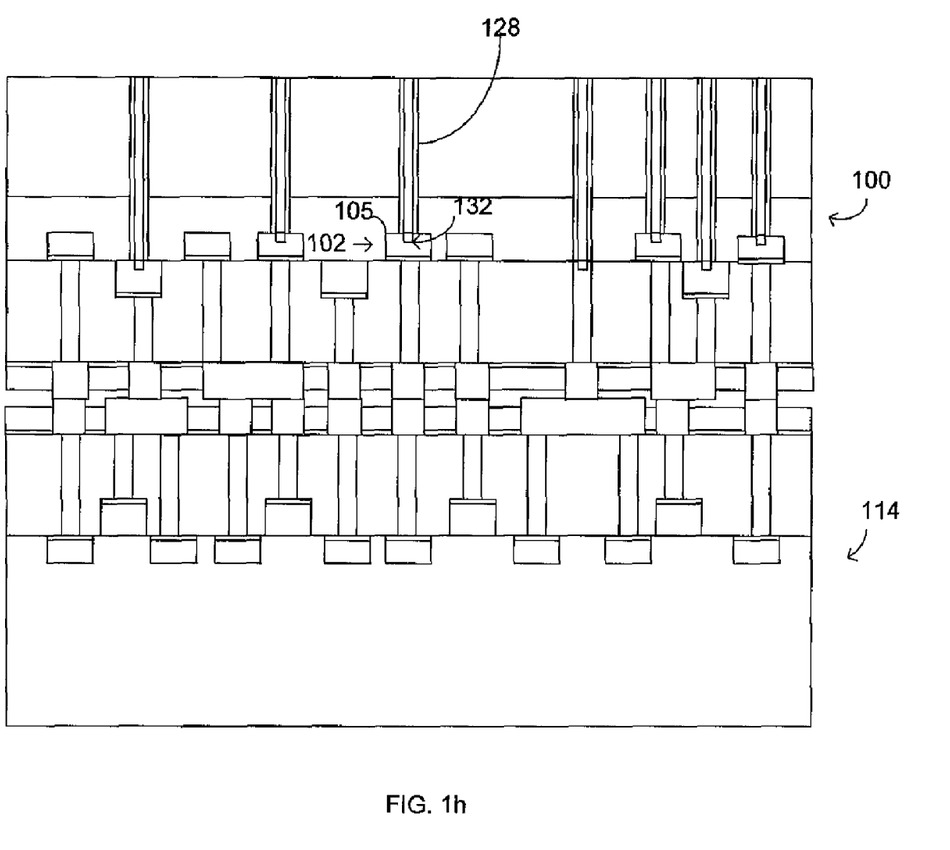

In other embodiments, at least one of the first and second substrates 100, 114 may comprise a silicon on insulator substrate (SOI). In those embodiments, the dielectric lining material 130 may be omitted, since the need for insulating the at least one via 128 will be substantially removed. In one embodiment, a reactive material 132 may be formed and/or reacted with the material comprising the at least one active feature 102 (FIG. 1h). In one embodiment, the reactive material may be disposed and or formed on the second side 105 of the at least one active feature 102.

For example, the reactive material 132 may comprise at least one of a nickel, titanium and cobalt material, and may react with the material comprising the at least one active feature 102, such as polysilicon and/or a metal material, in some embodiments. In one embodiment, the reactive material 132 may form a silicide with a surface of the at least one active feature 102. In one embodiment, the reactive material 132 may be reacted with the material comprising the at least one active feature 102 at a temperature of about 400 degrees Celsius or below. In one embodiment, the reactive material 132 may comprise a material that may provide an ohmic contact with the first substrates 100. In one embodiment, the temperature may be such that it may be compatible with any backside processing that may need to be subsequently performed.

Figure 1I:
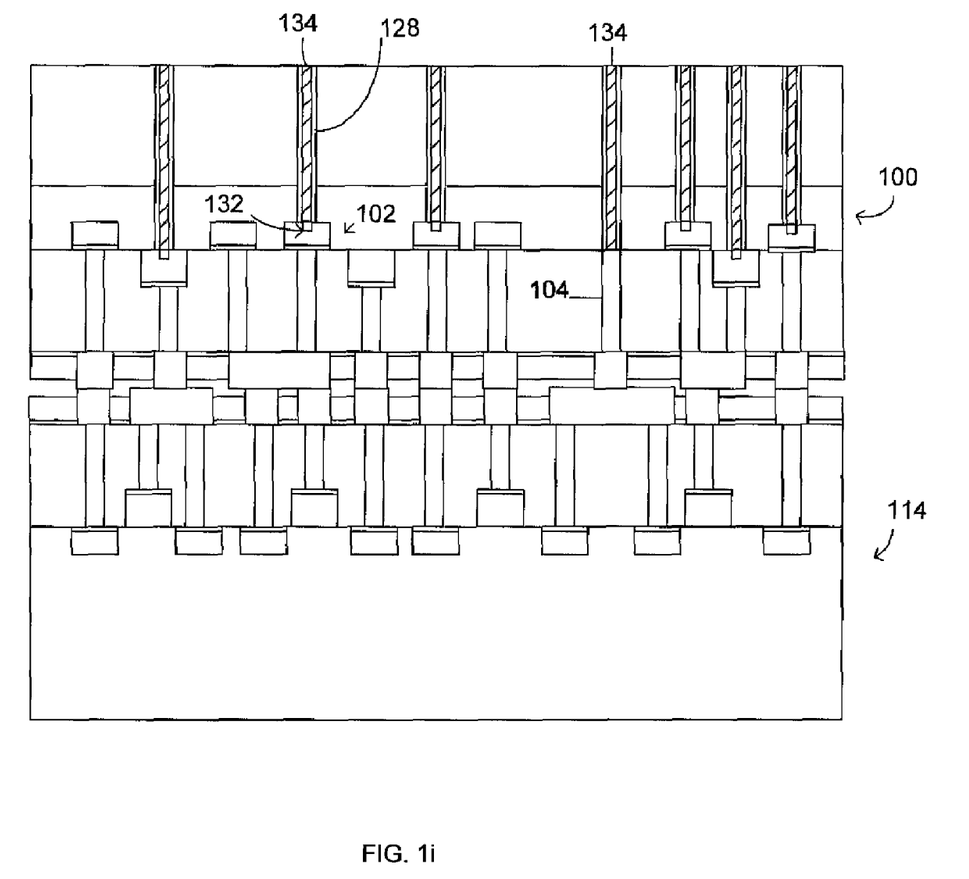

A conductive material 134 may be formed within the at least one via 128 and may substantially fill the at least one via 128 (FIG. 1i). In one embodiment, the conductive material 134 may comprise at least one of tungsten, copper and aluminum. In general, the conductive material may comprise any such conductive material suitable for forming conductive traces within a device, such as within a microelectronic device, for example. In one embodiment, the conductive material 134 may be electrically coupled with the reactive material 132 of the at least one active feature 102. The conductive material 134 may also electrically couple with the at least one interconnect structure 104.

Figure 1J:
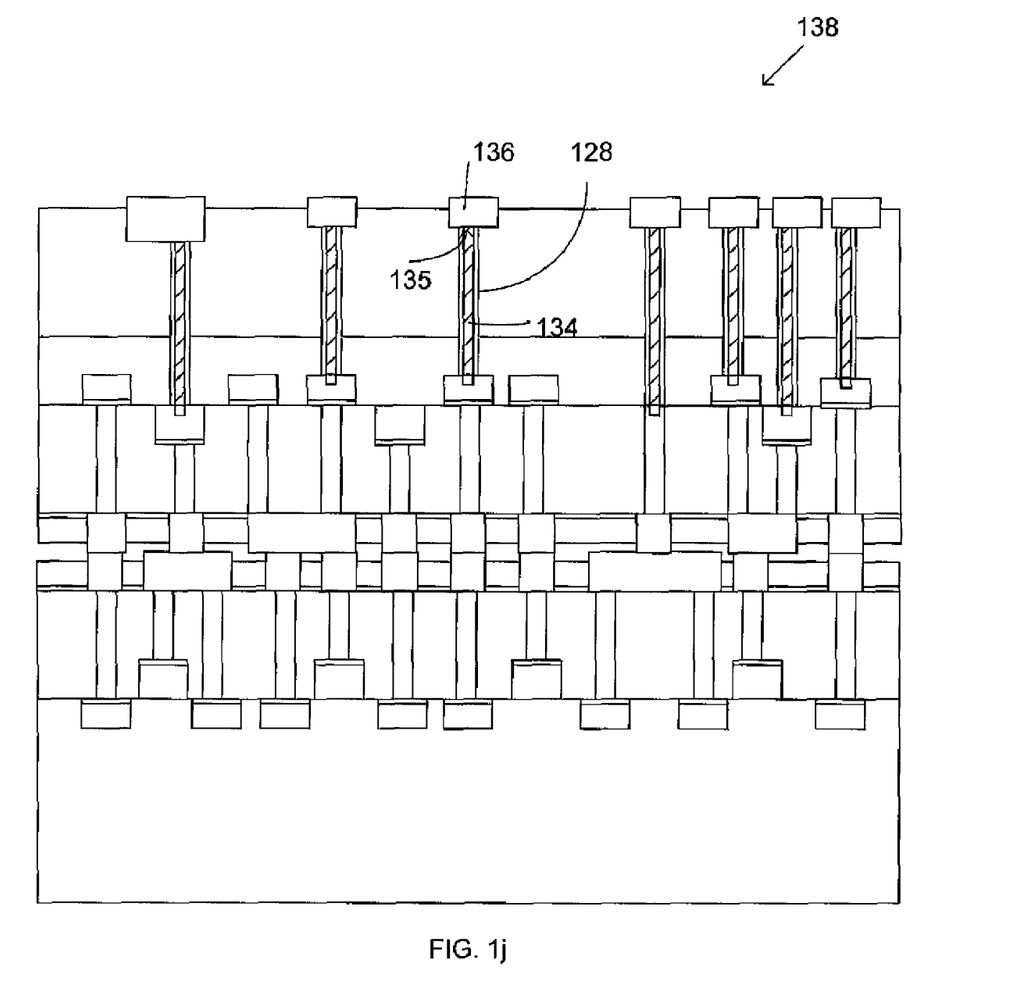

In one embodiment, at least one bonding pad 136 may be formed on a top surface 135 of the conductive material 134 (FIG. 1j). Thus, a stacked substrate structure 138 may be formed that enables direct bonding and backside suicide formation to individual active features, such as transistors, for example. By utilizing thru-layer vias to directly (in a substantially linear fashion) bond to such active areas, ultra dense three dimensional wafer stacking may be realized which may serve to minimize the consumption of the active area of a microelectronic device.

Figure 1K:
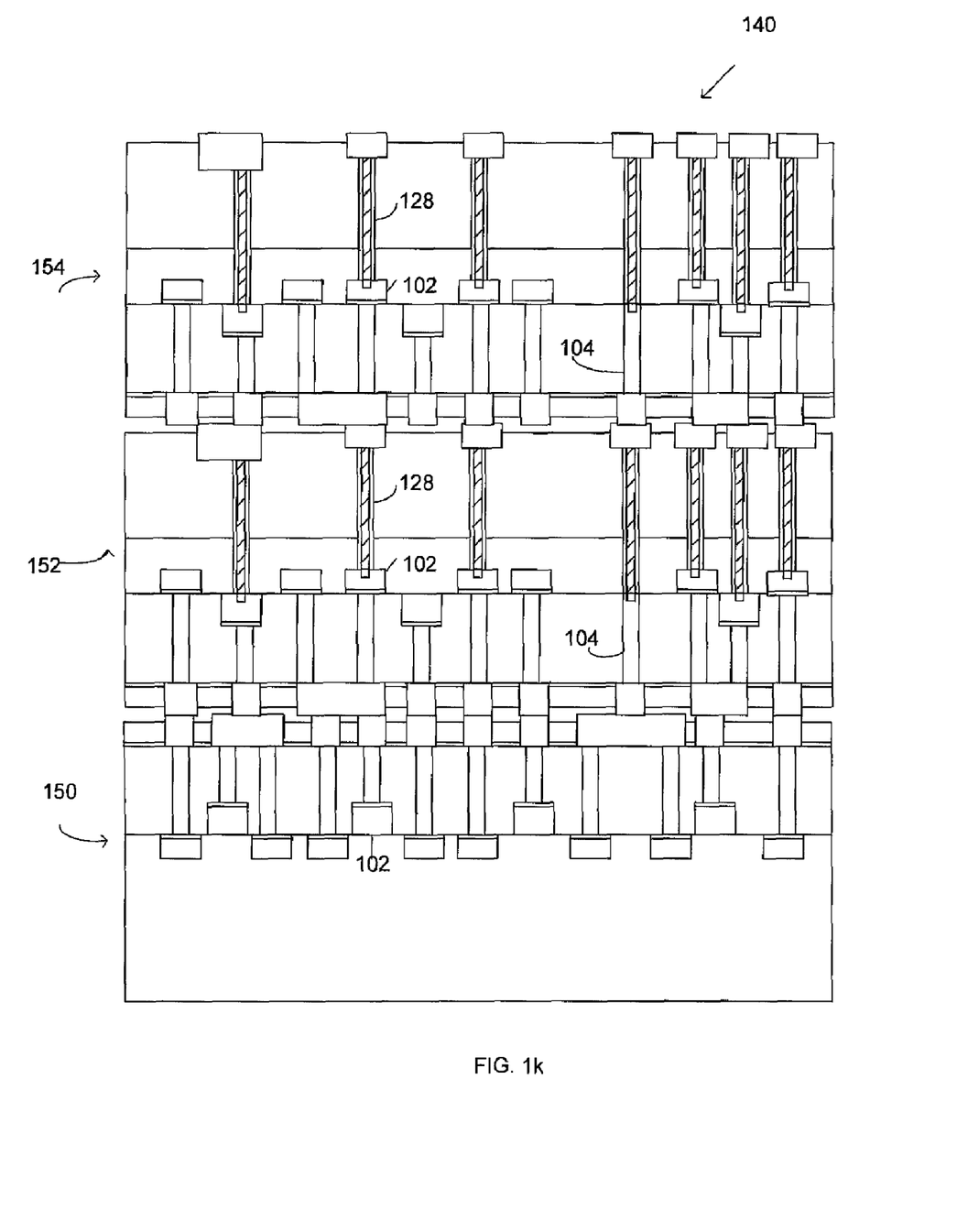

Multiple layers of substrates may be stacked (i.e., bonded) wherein individual transistors may be connected by interlayer vias that may incorporate silicide formation with active areas, according to embodiments of the present invention. For example, a three substrate stack 140, may comprise a first, second and third substrate 150, 152, 154 that may be directly connected to active features 102 and interconnect structures 104 by conductive bonding through at least one inter-layer via 128 (FIG. 1k). Such a configuration allows for the maximum connectivity of layers without impacting device layer density. Furthermore, the connections can be made in many ways. Multiple substrates may be stacked which comprise single metal layers per substrate or multiple metal layers per substrate (not shown). Additionally, the stacked structures of the present invention may comprise trigate stacked structures.

Figure 2:
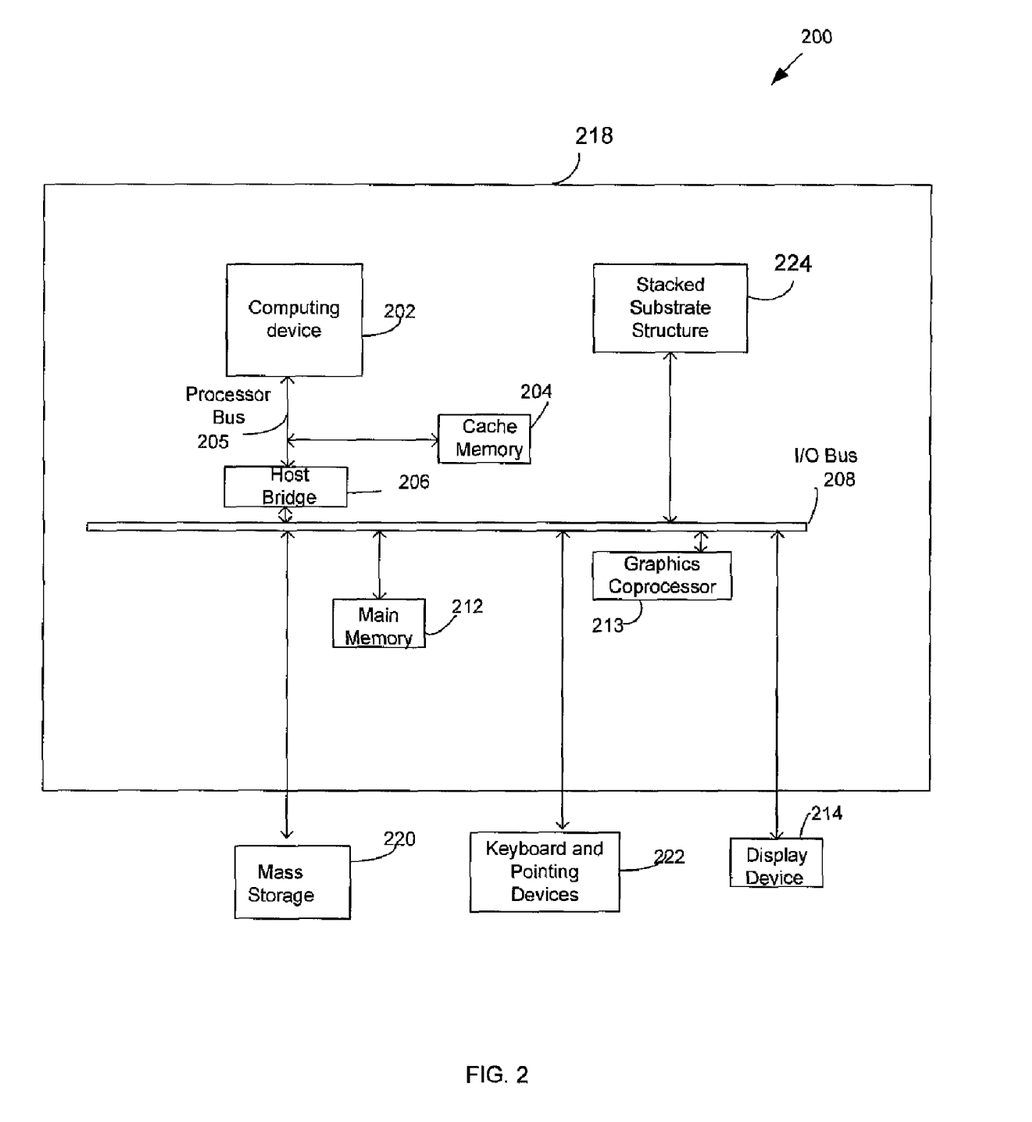
FIG. 2 represents a system according to another embodiment of the present invention.

FIG. 2 is a diagram illustrating an exemplary system 200 capable of being operated with methods for fabricating a microelectronic structure, such as the stacked substrate structure of FIG. 1j, for example. It will be understood that the present embodiment is but one of many possible systems in which the stacked substrate structures of the present invention may be used.

In the system 200, the stacked substrate structure 224 may be communicatively coupled to a printed circuit board (PCB) 218 by way of an I/O bus 208. The communicative coupling of the stacked substrate structure 224 may be established by physical means, such as through the use of a package and/or a socket connection to mount the stacked substrate structure 224 to the PCB 218 (for example by the use of a chip package, interposer and/or a land grid array socket). The stacked substrate structure 224 may also be communicatively coupled to the PCB 218 through various wireless means (for example, without the use of a physical connection to the PCB), as are well known in the art.

The system 200 may include a computing device 202, such as a processor, and a cache memory 204 communicatively coupled to each other through a processor bus 205. The processor bus 205 and the I/O bus 208 may be bridged by a host bridge 206. Communicatively coupled to the I/O bus 208 and also to the stacked substrate structure 224 may be a main memory 212. Examples of the main memory 212 may include, but are not limited to, static random access memory (SRAM) and/or dynamic random access memory (DRAM), and/or some other state preserving mediums. The system 200 may also include a graphics coprocessor 213, however incorporation of the graphics coprocessor 213 into the system 200 is not necessary to the operation of the system 200. Coupled to the I/O bus 208 may also, for example, be a display device 214, a mass storage device 220, and keyboard and pointing devices 222.

These elements perform their conventional functions well known in the art. In particular, mass storage 220 may be used to provide long-term storage for the executable instructions for a method for forming stacked substrate structures in accordance with embodiments of the present invention, whereas main memory 212 may be used to store on a shorter term basis the executable instructions of a method for forming stacked substrate structures in accordance with embodiments of the present invention during execution by computing device 202. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 212 may supply the computing device 202 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as substrate structures, are well known in the art. Therefore, the Figures provided herein illustrate only portions of an exemplary microelectronic structure that pertains to the practice of the present invention. Thus the present invention is not limited to the structures described herein.

What is claimed is:

1. A structure comprising:
    at least one bond pad of a device side of a first substrate coupled to at least one bond pad of a device side of a second substrate, wherein the second substrate comprises at least one of a gate and a source/drain;
    a via extending through the non-device side of the first substrate and disposed directly on a second side of a gate and a source/drain disposed within the first substrate, wherein the via comprises a dielectric lining on an inner portion of the via; and
    a silicide confined within the via on the second side of the one of the gate and the source/drain.

2. The structure of claim 1 wherein the via comprises a conductive material.

3. The structure of claim 2 wherein the conductive material comprises at least one of tungsten and copper.

4. The structure of claim 2 wherein the conductive material further comprises at least one bonding pad on a top surface of the conductive material.

5. The structure of claim 1 wherein a dielectric layer is disposed on a top surface of the non-device side of the first substrate.

6. The structure of claim 1 wherein at least one of the first substrate and the second substrate comprise a silicon on insulator substrate.

7. The structure of claim 1 wherein at least one of the first substrate and the second substrate comprise a silicon on insulator substrate.

8. The structure of claim 1 further comprising a system comprising:
    a bus communicatively coupled to the structure; and
    a DRAM communicatively coupled to the bus.

* * * * *